US 6,720,806 B1
United States Patent
Merrill et al.

(10) Patent No.: US 6,720,806 B1
(45) Date of Patent: Apr. 13, 2004

(54) METHOD AND CIRCUIT FOR PRODUCING A REFERENCE FREQUENCY SIGNAL USING A REFERENCE FREQUENCY DOUBLER HAVING FREQUENCY SELECTION CONTROLS

(75) Inventors: Allen Carl Merrill, Encinitas, CA (US); Joseph James Balardeta, Del Mar, CA (US); Sudhaker Reddy Anumula, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/132,463

(22) Filed: Apr. 25, 2002

(51) Int. Cl.$^7$ ............................................. H03B 19/00
(52) U.S. Cl. ........................ 327/116; 327/119; 327/294
(58) Field of Search ................ 327/156, 159, 327/147, 150, 3, 7, 12, 16, 17, 40, 43, 47, 49, 291, 293, 294, 116, 119, 99, 407; 331/1 A, 11, 18, 25, DIG. 2; 375/375, 376

(56) References Cited

U.S. PATENT DOCUMENTS

| | | | | |
|---|---|---|---|---|
| 5,297,179 A | * | 3/1994 | Tatsumi ........................ 377/47 |
| 5,317,284 A | * | 5/1994 | Yang ............................... 331/2 |
| 5,566,204 A | * | 10/1996 | Kardontchik et al. ....... 375/219 |
| 5,963,071 A | * | 10/1999 | Dowlatabadi ............... 327/175 |
| 5,994,930 A | * | 11/1999 | Park ............................. 327/116 |
| 6,028,460 A | * | 2/2000 | McCollum et al. ......... 327/156 |
| 6,107,891 A | * | 8/2000 | Coy ............................... 331/18 |
| 6,198,317 B1 | * | 3/2001 | Chow et al. ................ 327/116 |
| 6,480,045 B2 | * | 11/2002 | Albean ........................ 327/119 |
| 6,597,213 B1 | * | 7/2003 | Weintraub .................. 327/122 |

* cited by examiner

Primary Examiner—Timothy P. Callahan
Assistant Examiner—Hai L. Nguyen
(74) Attorney, Agent, or Firm—Incaplaw; Terrance A. Meador

(57) ABSTRACT

Circuitry for a phase locked loop (PLL) includes a reference signal input and a frequency doubler. The output of the frequency doubler is a second reference signal having a frequency that is approximately twice that of the initial reference signal, and which is fed into the PLL. The frequency doubler includes a first delay circuit having an input coupled to the input of the frequency doubler; and an XOR circuit having a first input coupled to an output of the delay circuit and a second input coupled to the input of the frequency doubler. The frequency doubler can include one or more additional delay circuits in series after the first delay circuit, the output of which is provided to a multiplexer. The multiplexer includes a selection signal input for selecting an output from at least one of the delay circuits to be provided to the XOR circuit. The frequency doubler allows the PLL to have a smaller feedback divider ratio and a higher loop gain for reducing jitter. The frequency doubler is provided with selection control for programming multiple frequencies.

7 Claims, 4 Drawing Sheets

METHOD AND CIRCUIT FOR PRODUCING A REFERENCE FREQUENCY SIGNAL USING A REFERENCE FREQUENCY DOUBLER HAVING FREQUENCY SELECTION CONTROLS

BACKGROUND OF THE INVENTION

The present invention relates generally to producing a reference frequency signal input for a phase locked loop (PLL), and more particularly to methods and apparatus for producing a reference frequency signal for a PLL with use of a reference frequency doubler.

A conventional phase locked loop (PLL) typically includes a frequency phase detector which receives a reference signal, a filter, a voltage-controlled oscillator (VCO), and a divider circuit. If the reference signal received by the frequency phase detector has a relatively low frequency, a large feedback divider ratio is required by the PLL. A large feedback divider ratio requires that the divider circuit have a relatively large number of dividers, which undesirably introduces phase "jitter" into the signals. The large feedback divider ratio also means that the loop gain of the PLL will be lower for a given supply voltage, which makes the gain distribution for noise less ideal and also increases jitter.

SUMMARY OF THE INVENTION

According to the present invention, circuitry for a phase locked loop (PLL) includes a reference signal input for providing a first reference signal having a first frequency. The circuitry further includes a frequency doubler that doubles the first frequency of the first reference signal, to produce a second reference signal having a second frequency that is approximately twice the first frequency. The second reference signal is received by a frequency phase detector of the PLL, which further includes a filter and voltage controlled oscillator that receives an output of the frequency phase detector, and a divider that receives the output of the filter and VCO. The output of the divider is looped back to the frequency phase detector for comparison with the second reference signal.

The increased (doubled) reference frequency allows the PLL to have a smaller feedback divider ratio and therefore fewer dividers; fewer dividers result in less circuitry in the PLL feedback path which reduces jitter. A reduced divider ratio also allows a higher loop gain for a given supply voltage, which produces a more ideal gain distribution for noise and reduces jitter as well. The frequency doubler is provided with selection control for programming multiple frequencies.

DETAILED DESCRIPTION OF THE PREFERRED EMBODIMENTS

According to this invention, circuitry for a phase locked loop (PLL) includes a frequency phase detector, a filter and voltage controlled oscillator (VCO) and a divider. An input to the filter and VCO is connected to an output of the frequency phase detector. An input to the divider is connected to an output of the filter and VCO. The output of the divider is provided to a second input of the frequency phase detector. A first input of the frequency phase detector receives a reference signal. In accordance with an embodiment of the invention, the reference signal is provided by a frequency doubler, which doubles the frequency of a first reference signal to generate a second reference signal having a frequency that is substantially twice the frequency of the first reference signal. The frequency doubler doubles the reference signal frequency into the PLL, which allows the PLL to have a smaller feedback divider ratio and a higher loop gain for reducing jitter. The frequency doubler is provided with selection control for programming multiple frequencies.

Figure 1:
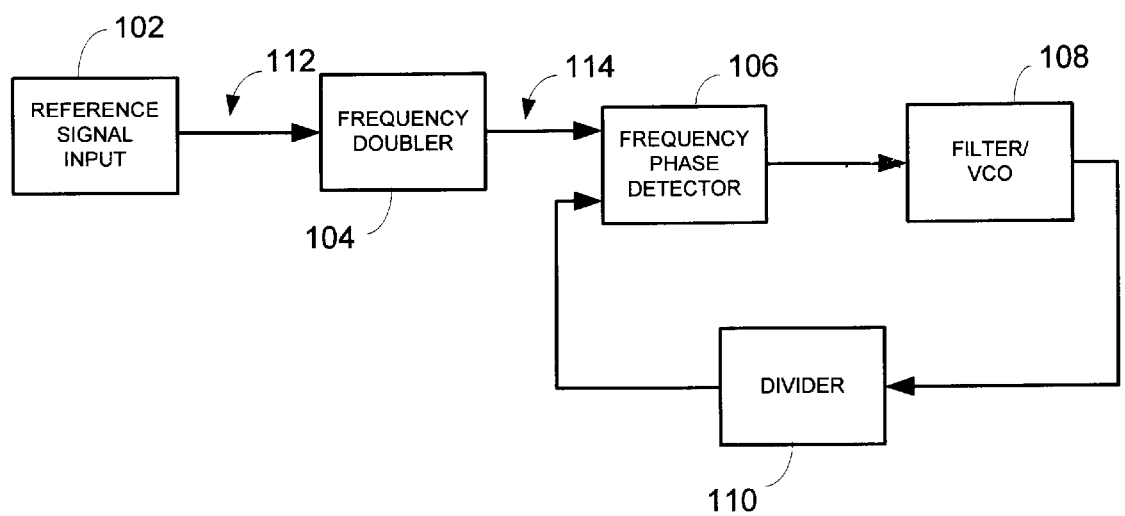
FIG. 1 is a schematic block diagram of the present invention for use with a phase locked loop (PLL)

FIG. 1 is a schematic block diagram of circuitry 100 using a frequency doubler 104 according to the invention. Circuitry 100 is preferably embodied in hardware, such as in an integrated circuit (IC) device, but alternatively may be embodied as preprogrammed gate array, or include software control. Circuitry 100 includes a reference signal input 102, a frequency doubler 104, and a phase locked loop (PLL) comprising a frequency phase detector 106, a filter and VCO 108 and a divider 110. Reference signal input 102 may include conventional circuitry, such as a crystal oscillator. An input of frequency doubler 104 is coupled to an output of reference signal input 102, and an output of frequency doubler 104 is coupled to one input of the frequency phase detector 106 of the PLL.

The frequency phase detector 106 has a first input coupled to the output of the frequency doubler 104, and an output coupled to an input of filter and VCO 108. Although shown in FIG. 1 as a single block, the filter and VCO 108 may include a filter coupled in series with a VCO where an output of the filter is coupled to an input of the VCO. An output of filter and VCO 108 is coupled to an input of divider 110, which has an output coupled to a second input of frequency phase detector 106.

Figure 2:
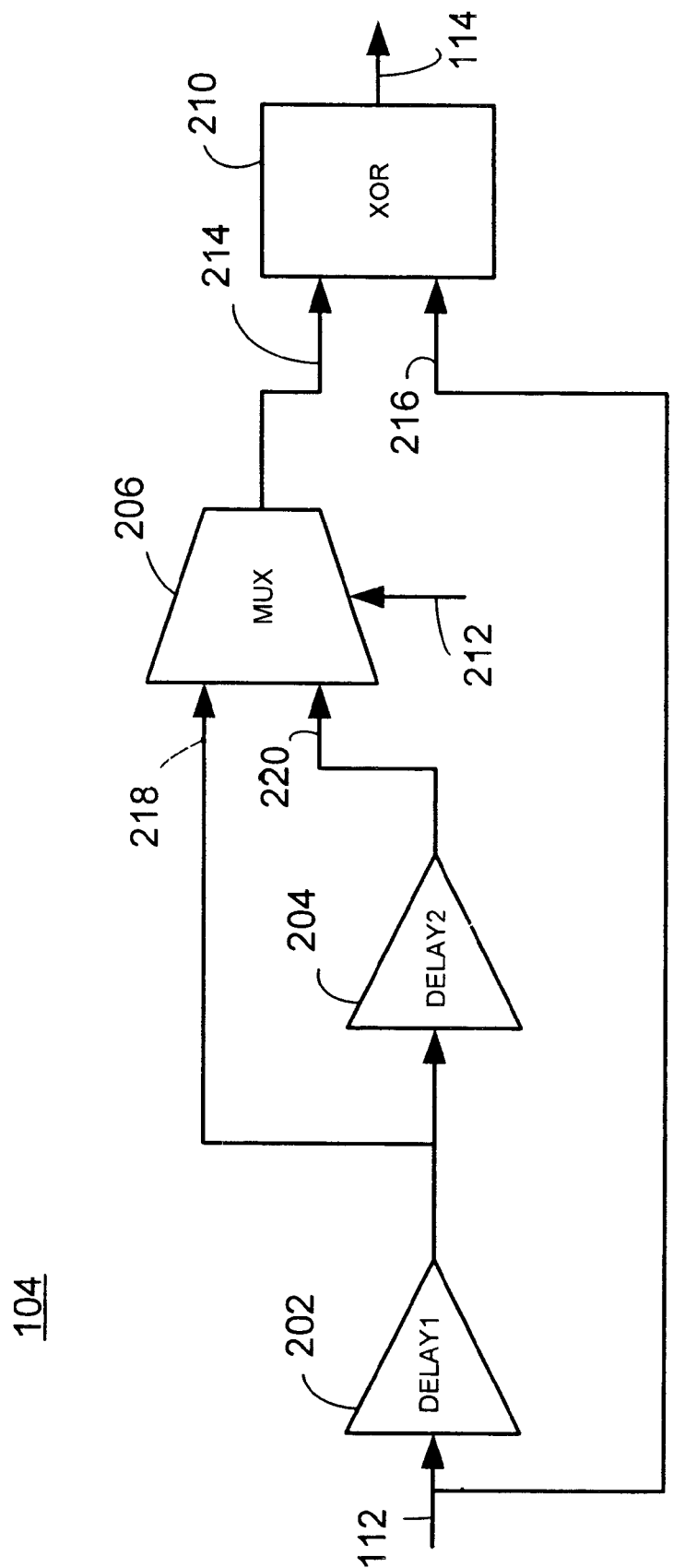
FIG. 2 is a schematic block diagram of a frequency doubler of FIG. 1.

Referring now to FIG. 2, a schematic block diagram of the frequency doubler 104 of FIG. 1 is shown. The frequency doubler 104 includes a delay circuit 202, a delay circuit 204, a multiplexer 206, and an XOR circuit 210. Delay circuit 202 is configured to provide a 90° delay for a particular frequency X. Together, delay circuits 202 and 204 are configured to provide a 90° delay for a different frequency Y, which is lower than frequency X. For lower frequency Y, each delay circuit 202 and 204 is configured to provide a 45° delay for the frequency Y.

Delay circuit 202 has an input which is the input to frequency doubler 104, and an output coupled to both an input of delay circuit 204 and a first input 218 of multiplexer 206. Delay circuit 204 has an output coupled to a second input 220 of multiplexer 206. A first input of XOR circuit 210 is coupled to an output of multiplexer 206, and a second input of XOR circuit 210 is coupled to the input of frequency doubler 104. A signal selection input 212 to multiplexer 206 is used for selectively coupling one of the first and the second inputs of multiplexer 206 to its output.

Figure 4:
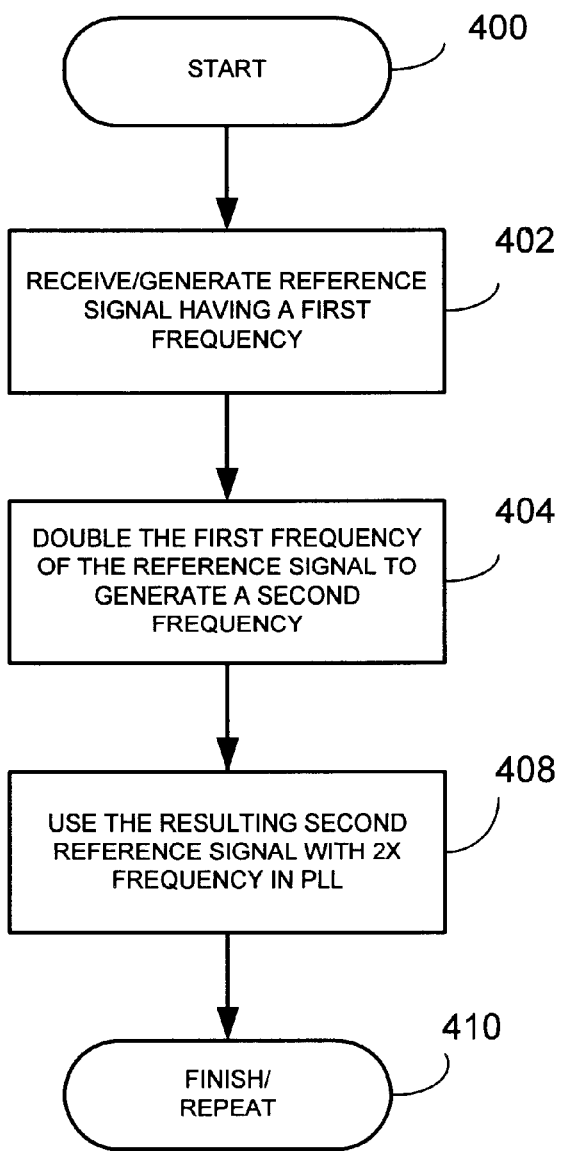
FIG. 4 is a flowchart describing a method of producing a reference frequency signal using the circuitry shown in FIG. 1.

FIG. 4 is a flowchart describing a method of producing a reference signal, which can be performed using circuitry 100 shown and described in relation to FIGS. 1 and 2. In the following description, FIGS. 1 and 4 will be referred to in combination. Beginning at a start block 400 of FIG. 4, a first reference signal having a first frequency is generated by reference signal input 102 (step 402) and/or received by the circuitry 100. The first frequency may be any frequency, but for example may be about 155 MHz. Next, the first frequency of the first reference signal is doubled by frequency doubler 104 to produce a second reference signal having a second frequency (step 404). The second frequency is approximately twice that of the first frequency. The second frequency may be, for example, about 310 MHz.

Next, the second reference signal having the second frequency is used in circuitry 100 (step 408). The flowchart ends at a finish block 410, but the method repeats continuously for a continuously applied reference signal from reference signal input 102. Furthermore, since circuitry 100 is configured to handle a reference signal with two or more different predetermined frequencies (which will be described in more detail below), the method as shown and described in relation to FIG. 4 may be continuously repeated for a different reference signal having a frequency different than the first frequency.

Operation of circuitry 100 of FIG. 1 is described in more detail for a first reference signal having the frequency X. Referring back to FIG. 2, selection signal input 212 of multiplexer 206 is set such that the first (top) input is selected as the output of multiplexer 206 and the second (bottom) input is ignored. The first reference signal at a line 112 is received at the input of delay circuit 202 and at the input of XOR circuit 210 at a line 216. This first reference signal is delayed by delay circuit 202 so that a first out-of-phase signal is produced at the output of delay circuit 202 at a line 218. The first out-of-phase signal is passed through multiplexer 206 at its output at a line 214. Thus, the output of XOR circuit 210 is the XOR of the first reference signal having frequency X at line 216 and the first out-of-phase signal having frequency X at line 214, producing a second reference signal having a frequency that is two times frequency X.

Figure 3A:
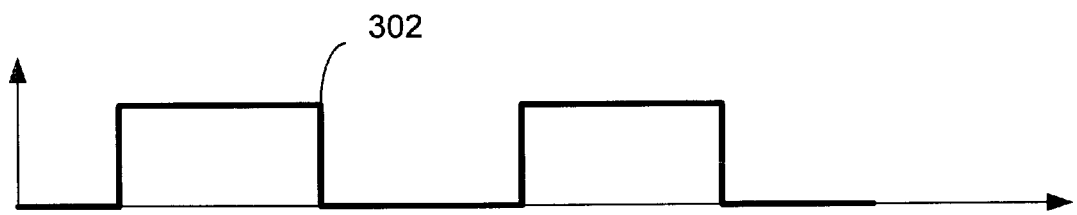
FIGS. 3A–3C are graphs of reference signals at various locations in the diagram of FIG. 2.
Figure 3B:
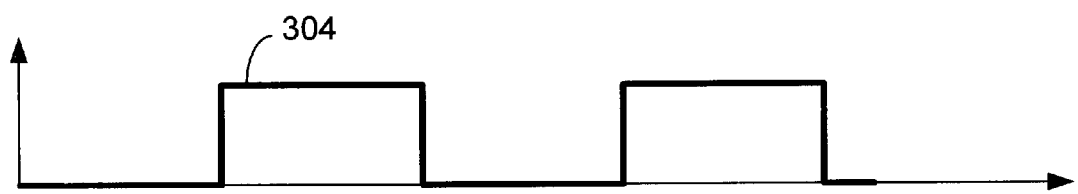
Figure 3C:
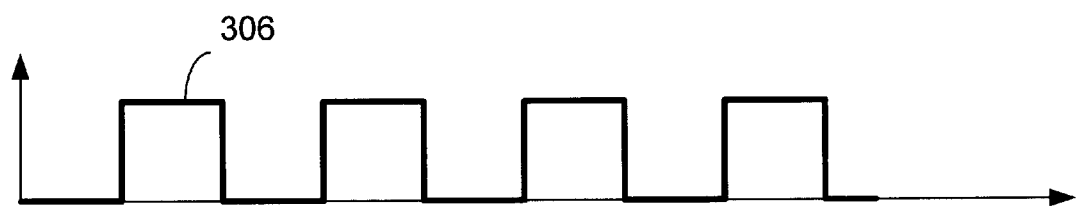

Referring to FIG. 3A, a signal 302 representing the first reference signal at lines 112 and 216 is shown. In FIG. 3B, a signal 304 representing the first out-of-phase signal at line 218 is shown. Since delay circuit 202 of FIG. 2 is configured as a 90° delay circuit for frequency X, signal 304 of FIG. 3B is 90° out-of-phase with signal 302 of FIG. 3A. In FIG. 3C, a resulting signal 306 at line 114 which is the XOR of the two aforementioned signals is shown. As illustrated, resulting signal 306 has a frequency 2*X.

Operation of circuitry 100 of FIG. 1 is now described in more detail for an alternative first reference signal having a frequency Y that is different from frequency X. For this embodiment, frequency Y is less than frequency X. Referring back to FIG. 2, selection signal input 212 of multiplexer 206 is set such that the second (bottom) input is selected as the output of multiplexer 206 and the first (top) input is ignored. The alternative first reference signal at line 112 is received at the input of delay circuit 202 and at the input of XOR circuit 210 at line 216. This first reference signal is delayed by delay circuit 202 so that the first out-of-phase signal is produced at the output of delay circuit 202 at line 218, but the first out-of-phase signal is also delayed by delay circuit 204 so that a second out-of-phase signal is produced at its output at a line 220. The second out-of-phase signal is passed through multiplexer 206 at its output at line 214. Delay circuit 204 is configured as a 45° delay circuit for frequency Y and, since delay circuit 202 is also configured as a 45° delay circuit for frequency Y, the resulting signal has a total delay of 90°. The output of XOR circuit 210 at line 114 is the XOR of the alternative first reference signal having frequency Y at line 216 and the second out-of-phase signal having frequency Y at line 214.

As one skilled in the art will readily understand, circuitry of frequency doubler 104 of FIG. 2 may be expanded using additional delay circuits and multiplexer inputs for handling additional first reference signals having a range of frequencies. On the other hand, if a reference signal having only a single predetermined frequency is to be utilized and output from reference signal input 102 of FIG. 1, then delay circuit 204 and multiplexer 206 of FIG. 2 are not necessary and can be excluded. In this case, the output of delay circuit 202 is coupled directly to the first input of XOR circuit 210.

Several advantages are conferred with use of the present invention. This increased (doubled) reference frequency at the input of the frequency phase detector allows the PLL to have a smaller feedback divider ratio and therefore fewer dividers; fewer dividers result in less circuitry in the PLL feedback path and reduces jitter. A reduced divider ratio also allows a higher loop gain for a given supply voltage, which produces a more ideal gain distribution for noise and reduces jitter as well.

Thus, a novel reference signal generator suitable for use with a PLL has been described herein. The reference signal generator may include a reference signal input and a frequency doubler. An output of the frequency doubler is coupled to an input of the PLL. The PLL may include a frequency phase detector having a first input coupled to the output of the frequency doubler; a filter having an input coupled to an output of the frequency phase detector; a voltage-controlled oscillator (VCO) having an input coupled to an output of the filter; and a divider having an input coupled to an output of the VCO and an output coupled to a second input of the frequency phase detector.

The frequency doubler includes a first delay circuit comprising an input of the frequency doubler, a second delay circuit, a multiplexer having a first input coupled to an output of the first delay circuit and a second input coupled to an output of the second delay circuit, an XOR circuit having a first input coupled to an output of the multiplexer and a second input coupled to the input of the frequency doubler; and an output of the XOR circuit comprising the output of the frequency doubler. The first delay circuit is configured to provide a 90° delay for a first reference signal. The second delay circuit is configured to provide a 90° delay of the delayed reference signal.

The frequency doubler also includes a second delay circuit having an input coupled to the output of the first delay circuit; and a multiplexer including a first input coupled to the output of the first delay circuit; a second input coupled to an output of the second delay circuit; an output coupled to the first input of the XOR circuit; and a signal selection input for selecting one of the alternate inputs of the multiplexer to be provided at the output of the multiplexer. The first and second delay circuits are together configured to provide a 90° delay for an alternative first reference signal.

In addition, a novel method described herein includes receiving a first reference signal having a first frequency; doubling the first frequency of the first reference signal to produce a second reference signal having a second frequency that is approximately twice the first frequency; and providing the second reference signal to the PLL. Doubling the frequency of the first and/or alternative first reference signal serves to reduce jitter in the PLL. Delaying the first reference signal to produce the first out-of-phase signal also includes delaying the first (and/or alternative first) reference signal by 90°.

It is to be understood that the above is merely a description of preferred embodiments of the invention and that various changes, alterations, and variations may be made without departing from the true spirit and scope of the invention as set for in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A method of producing a reference signal for use with a phase locked loop (PLL), the method comprising:
   selecting a first reference signal having either a first frequency or a second frequency; and
   doubling the first frequency or the second frequency of the first reference signal to produce a second reference signal having a frequency that is approximately twice the respective first frequency or second frequency;
   wherein doubling the frequency of the first reference signal further comprises:
      delaying the first reference signal to produce a first out-of-phase signal;
      delaying the first out-of-phase signal to produce a second out-of-phase signal;
      selecting the first out-of-phase signal if the first reference signal has the first frequency, or the second out-of-phase signal if the first reference signal has the second frequency; and
      XORing the first reference signal and the selected first or second out-of-phase signal to produce the second reference signal having the frequency that is twice the respective first frequency or second frequency.

2. The method of claim 1, wherein delaying the first reference signal to produce the first out-of-phase signal further comprises delaying the first reference signal by 90°.

3. The method of claim 1, wherein delaying the first reference signal to produce the first out-of-phase signal further comprises delaying the first reference signal by 45°, and wherein delaying the first out-of-phase signal to produce a second out-of-phase signal further comprises delaying the first out-of-phase signal by 45°.

4. The method of claim 1, wherein the second frequency of the first reference signal is less than the first frequency of the first reference signal.

5. An integrated circuit (IC), comprising:
   a reference frequency generator input for generating a first reference frequency, a frequency doubler connected to the input, and an output; and
   a phase locked loop (PLL);
   the frequency doubler including:
      a delay circuit coupled to the input;
      an XOR circuit having a first input coupled to an output of the delay circuit and a second input coupled to the input; and
      an output of the first XOR circuit coupled to the input
   the PLL including:
      a frequency phase detector having a first input coupled to the output of the reference frequency generator;
      a filter having an input coupled to an output of the frequency phase detector;
      a voltage-controlled oscillator (VCO) having an input coupled to an output of the filter;
      a divider having an input coupled to an output of the VCO and an output coupled to a second input of the frequency phase detector; and
   the delay circuit including:
      a first delay element coupled to the input;
      a second delay element having in input coupled to an output of the first delay element; and
      a multiplexer, having a first input coupled to the output of the first delay element and a second input coupled to an output of the second delay element, and having an output coupled to the first input of the XOR circuit, the multiplexer for selecting the output of the first delay element or the second delay element based on a frequency of the first reference signal.

6. The IC of claim 5, wherein the first delay element is configured to provide a 90° phase shift delay.

7. The IC of claim 5, wherein the first delay element and the second delay element are configured to provide a 45° phase shift delay.

* * * * *